United States Patent
Yamashita et al.

(10) Patent No.: US 8,710,613 B2
(45) Date of Patent: Apr. 29, 2014

(54) PICKUP DEVICE AND METHOD FOR MANUFACTURING THE SAME

(75) Inventors: Yuichiro Yamashita, Ebina (JP); Masahiro Kobayashi, Tokyo (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 209 days.

(21) Appl. No.: 12/899,404

(22) Filed: Oct. 6, 2010

(65) Prior Publication Data
US 2011/0084316 A1 Apr. 14, 2011

(30) Foreign Application Priority Data
Oct. 9, 2009 (WO) ............... PCT/JP2009/067600

(51) Int. Cl.
*H01L 27/146* (2006.01)

(52) U.S. Cl.
CPC .... *H01L 27/14603* (2013.01); *H01L 27/14609* (2013.01)
USPC ............... 257/463; 257/431; 257/E27.131; 257/E27.133

(58) Field of Classification Search
CPC ............ H01L 27/14603; H01L 27/14609
USPC ......... 257/239, 428, E27.132, E27.133, 431, 257/463, E27.131
See application file for complete search history.

(56) References Cited

U.S. PATENT DOCUMENTS

| | | | | |
|---|---|---|---|---|
| 6,486,498 | B2 * | 11/2002 | Yamashita | 257/72 |
| 7,224,003 | B2 * | 5/2007 | Nakamura et al. | 257/184 |
| 7,361,877 | B2 * | 4/2008 | McGrath et al. | 250/208.1 |
| 7,414,233 | B2 | 8/2008 | Asaba | |
| 2005/0040393 | A1 | 2/2005 | Hong | |
| 2006/0046338 | A1* | 3/2006 | Patrick et al. | 438/57 |
| 2006/0086996 | A1 | 4/2006 | Kuwazawa | |
| 2006/0158539 | A1 | 7/2006 | Koizumi | |
| 2006/0219868 | A1 | 10/2006 | Morimoto | |

FOREIGN PATENT DOCUMENTS

| | | |
|---|---|---|
| JP | 2002-368201 A | 12/2002 |
| JP | 2005-223134 A | 8/2005 |
| JP | 2006-120966 A | 5/2006 |
| JP | 2006-197383 A | 7/2006 |
| JP | 2006-311515 A | 11/2006 |
| JP | 2007-503722 A | 2/2007 |
| JP | 2008-4692 A | 1/2008 |
| JP | 2009-38167 A1 | 2/2009 |

\* cited by examiner

*Primary Examiner* — John C Ingham
(74) *Attorney, Agent, or Firm* — Canon USA, Inc. IP Division (57) ABSTRACT

A pickup device according to the present invention includes a photoelectric conversion portion, a charge holding portion configured to include a first semiconductor region, and a transfer portion configured to include a transfer gate electrode that controls a potential between the charge holding portion and a sense node. A second semiconductor region is disposed on a surface of a semiconductor region between the control electrode and the transfer gate electrode. A third semiconductor region is disposed below the second semiconductor region. An impurity concentration of the third semiconductor region is higher than the impurity concentration of the first semiconductor region.

10 Claims, 7 Drawing Sheets

PICKUP DEVICE AND METHOD FOR MANUFACTURING THE SAME

TECHNICAL FIELD

The present invention relates to a solid-state image pickup device. More specifically, the present invention relates to a solid-state image pickup device in which each of pixels has a charge holding portion.

BACKGROUND ART

In recent years, a configuration in which each of pixels has a charge holding portion separated from a photoelectric conversion portion and a floating diffusion (hereinafter FD) has been considered for higher performance of a solid-state image pickup device. The charge holding portion is provided in each pixel in order to realize a global electronic shutter, as described in U.S. Pat. No. 7,414,233 and Japanese Patent Laid-Open No. 2008-004692, or in order to expand a dynamic range, as described in Japanese Patent Laid-Open No. 2006-197383. Furthermore, the charge holding portion is provided in each pixel also in a configuration in which each pixel has an analog-to-digital (AD) converter, as described in Japanese Patent Laid-Open No. 2009-038167.

U.S. Pat. No. 7,414,233 discloses a configuration in which a P-type semiconductor region is disposed on a surface portion so as to separate an electrode TX1 on a charge holding portion formed of an N-type semiconductor region and an electrode TX2 for transferring charges in the charge holding portion from each other. Such a configuration prevents a dark current flowing to an accumulation region.

However, according to the configuration of U.S. Pat. No. 7,414,233, a P-type semiconductor region is disposed so as to separate two transfer gate structures from each other, and an N-type semiconductor region constituting a charge holding portion is disposed thereunder. Thus, it is difficult to control charge transfer efficiency in a charge path under the P-type semiconductor region, which is disposed to separate two transfer gate structures, independently of an impurity concentration of the charge holding portion. Therefore, if high priority is put on the performance of the charge holding portion, it is difficult to increase transfer efficiency in a charge path extending from the charge holding portion to a sense node.

The present invention has been made on the basis of this problem, and is directed to increasing charge transfer efficiency from a charge holding portion to an FD regardless of an impurity concentration of the charge holding portion.

SUMMARY OF INVENTION

According to the present invention, there is provided a pickup device including a plurality of pixels. Each pixel includes a photoelectric conversion portion configured to generate charges in accordance with incident light, a charge holding portion configured to include a first semiconductor region that holds the generated charges in a portion different from the photoelectric conversion portion, and a transfer portion configured to include a transfer gate electrode that controls a potential between the charge holding portion and a sense node. The charge holding portion includes a control electrode that is disposed above the first semiconductor region via an insulating film. A second semiconductor region is disposed on a surface of a semiconductor region between the control electrode and the transfer gate electrode. A third semiconductor region is disposed in a charge path extending from the charge holding portion to the sense node below the second semiconductor region. An impurity concentration of the third semiconductor region is higher than an impurity concentration of the first semiconductor region.

Further features of the present invention will become apparent from the following description of exemplary embodiments with reference to the attached drawings.

DESCRIPTION OF EMBODIMENTS

Hereinafter, embodiments of the present invention will be described in detail. Regarding the conductivity type of semiconductor, the description will be given under the assumption that a first-conductivity-type is N-type and that a second-conductivity-type is P-type, but the opposite is also acceptable. The difference depends on whether signal charges are electrons or holes. The cross-sectional views of each pixel illustrate a portion of one pixel, but a plurality of pixels are provided in a real device.

First Embodiment

Figure 1:
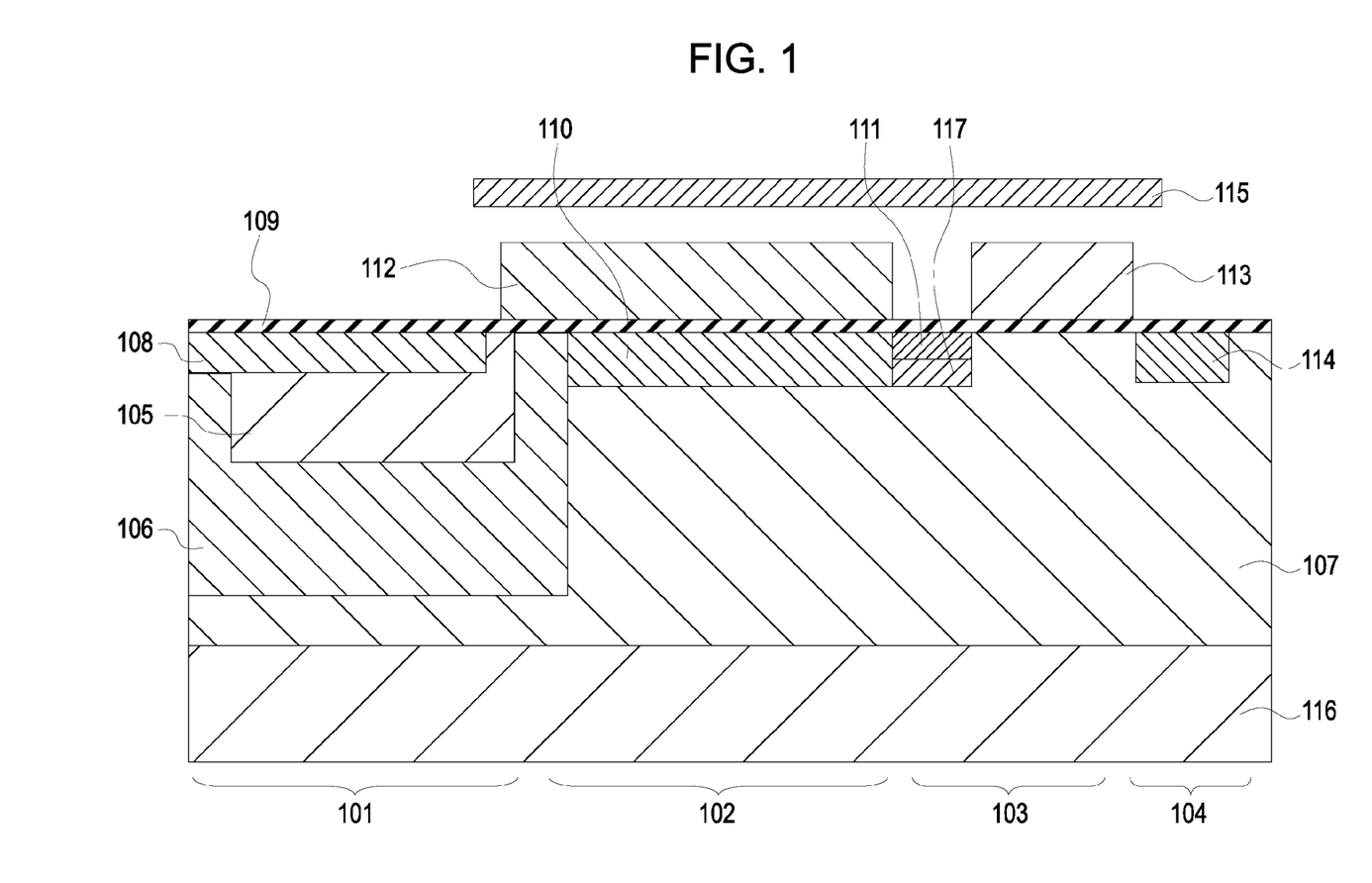
FIG. 1 is a schematic view of a cross section of a pixel of a solid-state image pickup device according to a first embodiment.

FIG. 1 is a schematic view of a cross section of a pixel of a solid-state image pickup device according to an embodiment of the present invention.

Reference numeral 101 denotes a photoelectric conversion portion. A photodiode configured to include a P-type semiconductor region and an N-type semiconductor region is used, for example. Reference numeral 102 denotes a charge holding portion. The charge holding portion 102 is configured to include an N-type semiconductor region (first semiconductor region) capable of holding charges generated by the photoelectric conversion portion. Reference numeral 103 denotes a transfer portion. The transfer portion 103 transfers charges held by the charge holding portion to a sense node. Reference numeral 104 denotes the sense node. The sense node is a floating diffusion (FD) that is electrically connected to the gate of a metal-oxide semiconductor (MOS) transistor for pixel amplification, for example. The sense node may be electrically connected to a vertical signal line (not illustrated), instead of being electrically connected to the gate of the MOS transistor for pixel amplification.

Next, specific configurations of the foregoing individual members will be described. In this embodiment, the photoelectric conversion portion 101, the charge holding portion 102, the transfer portion 103, and the sense node 104 are arranged in a P-type well 107. The P-type well 107 is formed on a surface side of an N-type substrate 116 through ion implantation or epitaxial growth. A P-type semiconductor substrate may be used instead of the N-type substrate 116 on which the P-type well 107 is formed.

Reference numerals 105 and 106 denote N-type semiconductor regions. The N-type semiconductor region 105 is formed in the N-type semiconductor region 106 and has an N-type impurity concentration higher than that of the N-type semiconductor region 106. The N-type semiconductor region 105 forms a PN junction together with the P-type semiconductor region 108. The N-type semiconductor region 106 forms a PN junction together with the P-type well 107.

Reference numeral 108 denotes a high-concentration P-type semiconductor region. Providing the P-type semiconductor region 108 enables reduction of a dark current that is generated on a surface of semiconductor. In this embodiment, the foregoing photoelectric conversion portion 101 is constituted by the N-type semiconductor regions 105 and 106, the P-type well 107, and the high-concentration P-type semiconductor region 108.

Reference numeral 110 denotes an N-type semiconductor region. In this embodiment, the N-type semiconductor region 110 is a first semiconductor region that holds charges in a portion different from the photoelectric conversion portion. Reference numeral 112 denotes a control electrode. The foregoing charge holding portion 102 is configured to include the N-type semiconductor region 110 and the control electrode 112.

In the charge holding portion 102 according to this embodiment, the control electrode 112 is disposed above the N-type semiconductor region 110 via an insulating film 109. The control electrode 112 controls the potential on a semiconductor surface side of the N-type semiconductor region 110. A negative voltage may be applied to the control electrode so as to suppress an influence of a dark current generated in the charge holding portion.

Reference numeral 113 denotes a transfer gate electrode. A bias supplied to the transfer gate electrode 113 causes a transfer path of electrons to be formed in part of the P-type well 107 adjacent to the N-type semiconductor region 110. The transfer gate electrode 113 switches between a transfer path formation state and a transfer path non-formation state in accordance with a bias supplied thereto, and controls the electrical connection between the charge holding portion and the FD.

An N-type semiconductor region 114 is an FD. In this embodiment, the FD 114 functions as a sense node. The sense node may be a semiconductor region from which a signal is output in accordance with the amount of charges accumulated therein.

Reference numeral 115 denotes a light shielding member. The light shielding member 115 reduces incident light to the charge holding portion 102, the transfer portion 103, and the sense node 104, more preferably, completely shields incident light thereto.

Reference numeral 111 denotes a P-type semiconductor region (second semiconductor region). The P-type semiconductor region 111 is disposed in a surface portion between the control electrode 112 and the transfer gate electrode 113. Providing this P-type semiconductor region enables suppression of a dark current in a charge transfer path for transferring charges to the FD 114.

Reference numeral 117 denotes an N-type semiconductor region (third semiconductor region). The N-type semiconductor region 117 is disposed under the P-type semiconductor region 111. The N-type semiconductor region 117 is disposed in a step different from a step of disposing the N-type semiconductor region 110 constituting the charge holding portion, as a configuration separate from the N-type semiconductor region 110. The P-type semiconductor region 111 and the N-type semiconductor region 117 form a PN junction. The impurity concentration of the N-type semiconductor region 117 is higher than the impurity concentration of the N-type semiconductor region 110.

According to this configuration, a transfer characteristic can be determined without depending on the impurity concentration of the N-type semiconductor region 110, and thus a saturation charge amount in the charge holding portion can be independently designed. Specifically, the impurity concentration of the N-type semiconductor region 117 is preferably high to some extent for increasing charge transfer efficiency. However, if the N-type semiconductor region 117 is configured as an extended portion of the N-type semiconductor region 110 that constitutes the charge holding portion, the impurity concentration of the entire N-type semiconductor region 110 is too high. In such a configuration, a voltage for transferring most of charges, preferably, all of charges from the charge holding portion is high. In contrast, the impurity concentration of the N-type semiconductor region 110 is preferably set to low to some extent so that the voltage used for transfer is not so high. However, if the N-type semiconductor region 117 is configured as an extended portion of the N-type semiconductor region 110 that constitutes the charge holding portion, the impurity concentration of the N-type semiconductor region 117 is low and the charge transfer efficiency decreases. Therefore, as in this embodiment, the N-type semiconductor regions 110 and 117 are formed as regions separate from each other, and the impurity concentration of the N-type semiconductor region 117 is set to be higher than that of the N-type semiconductor region 110, so that the transfer efficiency can be increased without increasing a voltage used for transfer.

Also, according to this embodiment, a dark current and variations of saturation caused by displacement of charge holding portions of individual pixels due to variation of process can be reduced.

Second Embodiment

Figure 2:
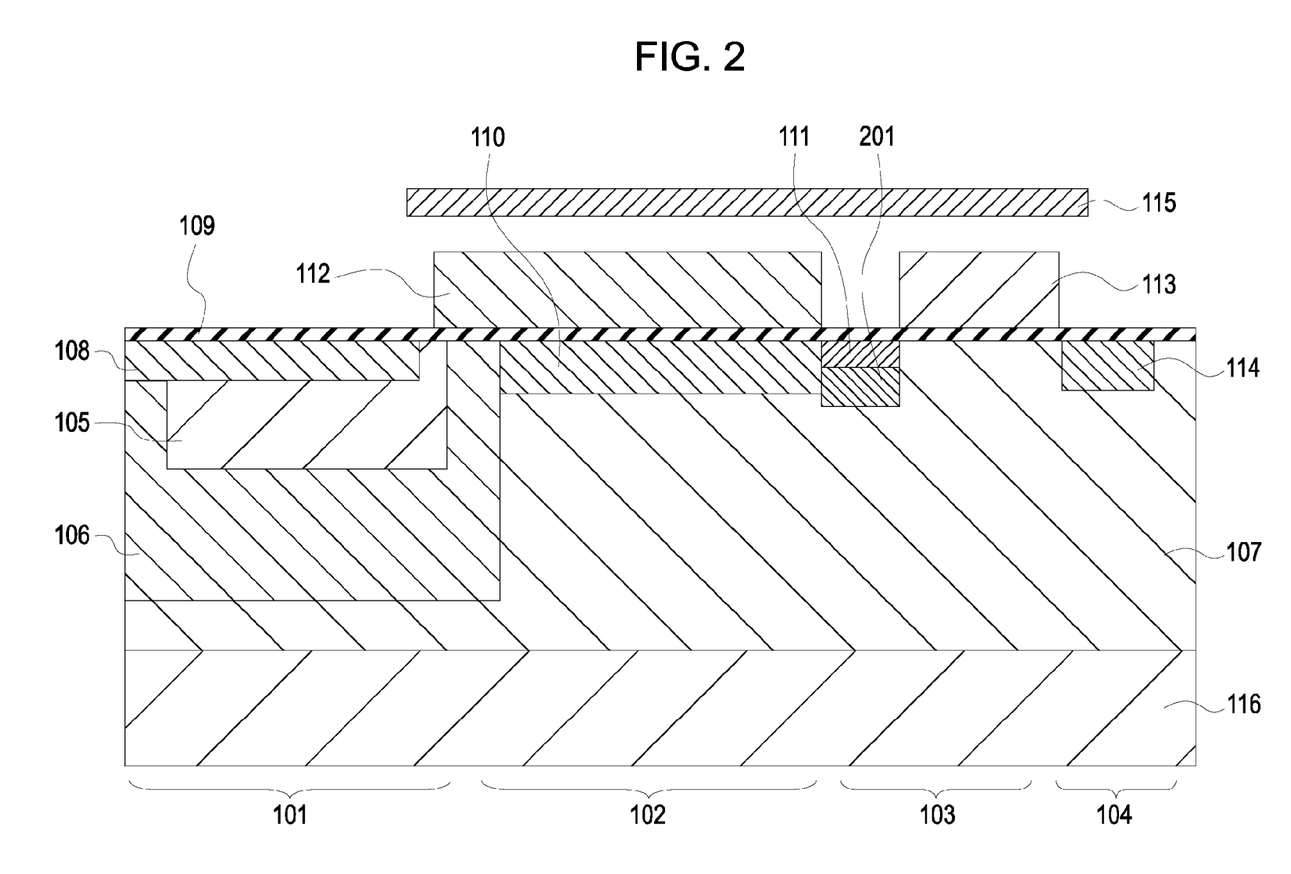
FIG. 2 is a schematic view of a cross section of a pixel of a solid-state image pickup device according to a second embodiment.

FIG. 2 is a schematic view of a cross section of a pixel according to this embodiment. The parts having the same function as that in the first embodiment are denoted by the same reference numerals, and a detailed description thereof will be omitted.

A difference between this embodiment and the first embodiment is the depth at which the N-type semiconductor region 201 is disposed. In the first embodiment, the N-type semiconductor region 201 is disposed at almost the same depth as the N-type semiconductor region 110. In this embodiment, the N-type semiconductor region 201 is disposed at the depth greater than the depth at which the N-type semiconductor region 110 is disposed.

According to this embodiment, the effect obtained in the first embodiment can be obtained. In addition, accumulation of charges in the charge path extending from the charge holding portion to the sense node can be suppressed.

Third Embodiment

Figure 3:
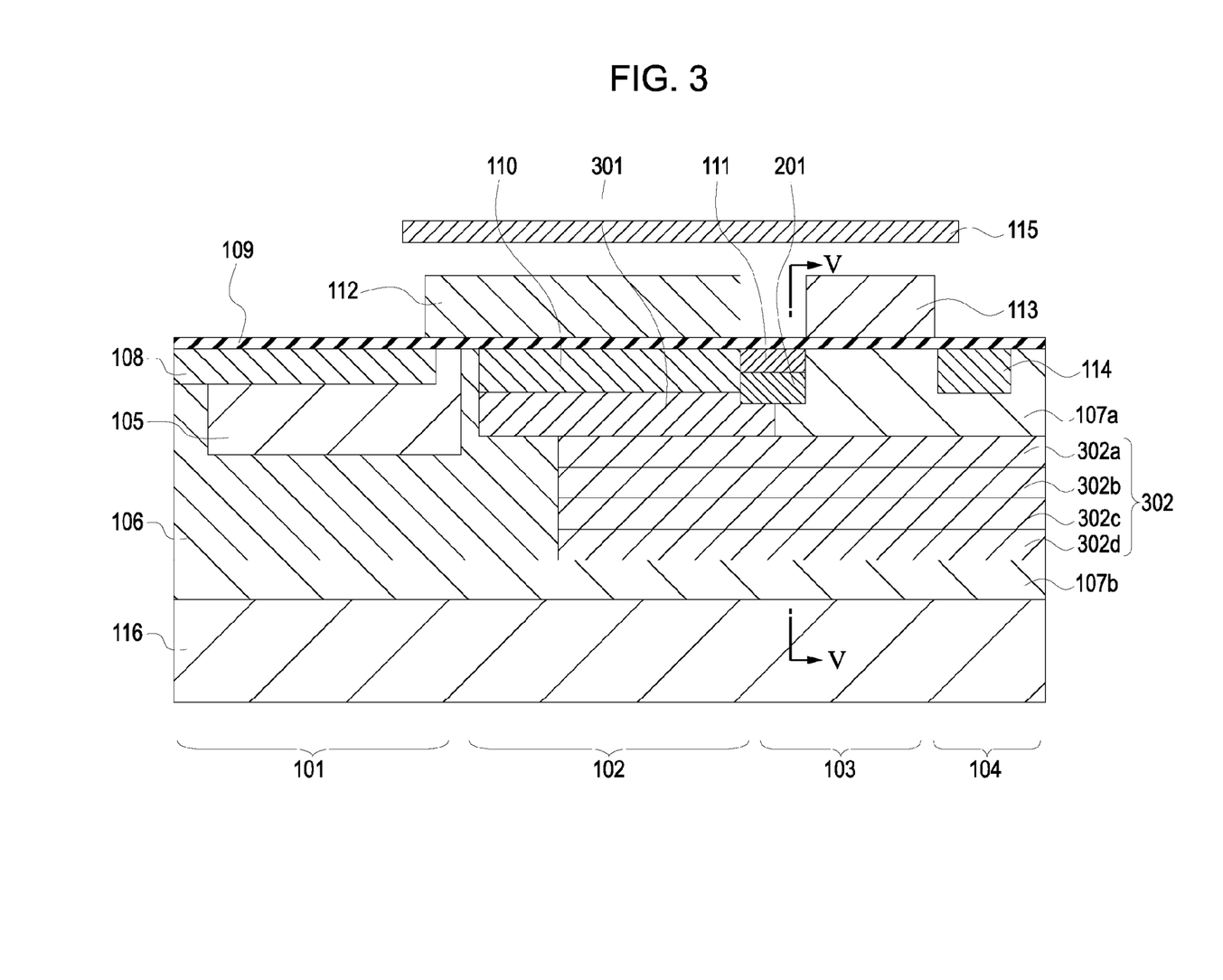
FIG. 3 is a schematic view of a cross section of a pixel of a solid-state image pickup device according to a third embodiment.
Figure 4:
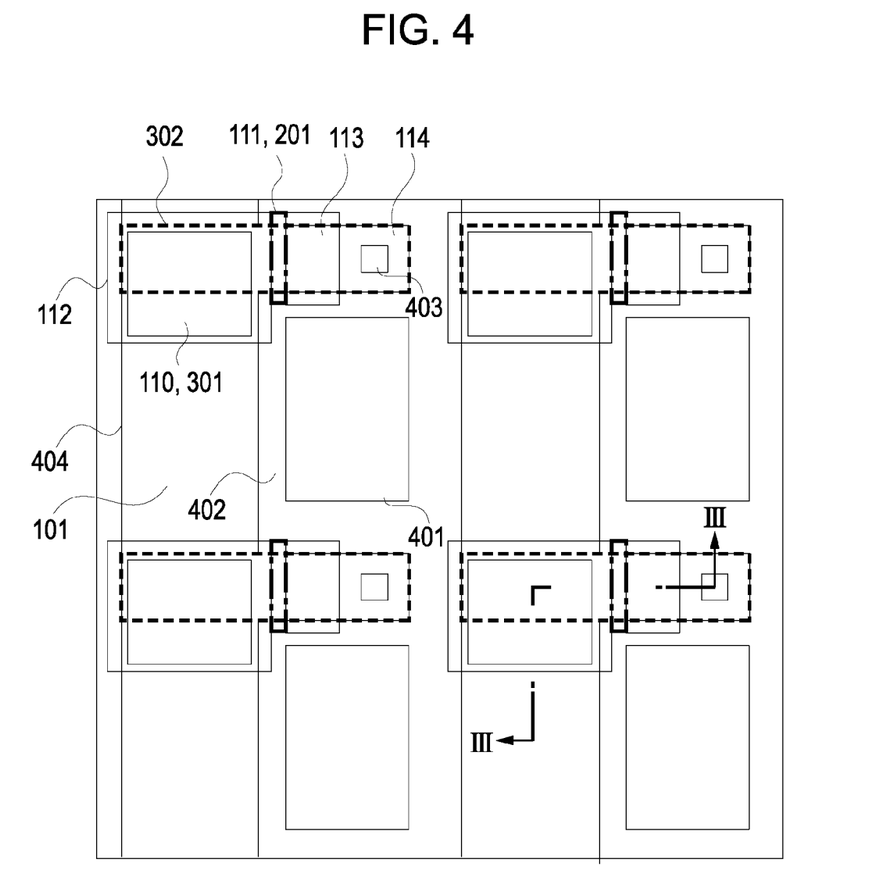
FIG. 4 is a schematic view of an upper surface of pixels of the solid-state image pickup device according to the third embodiment.
Figure 5:
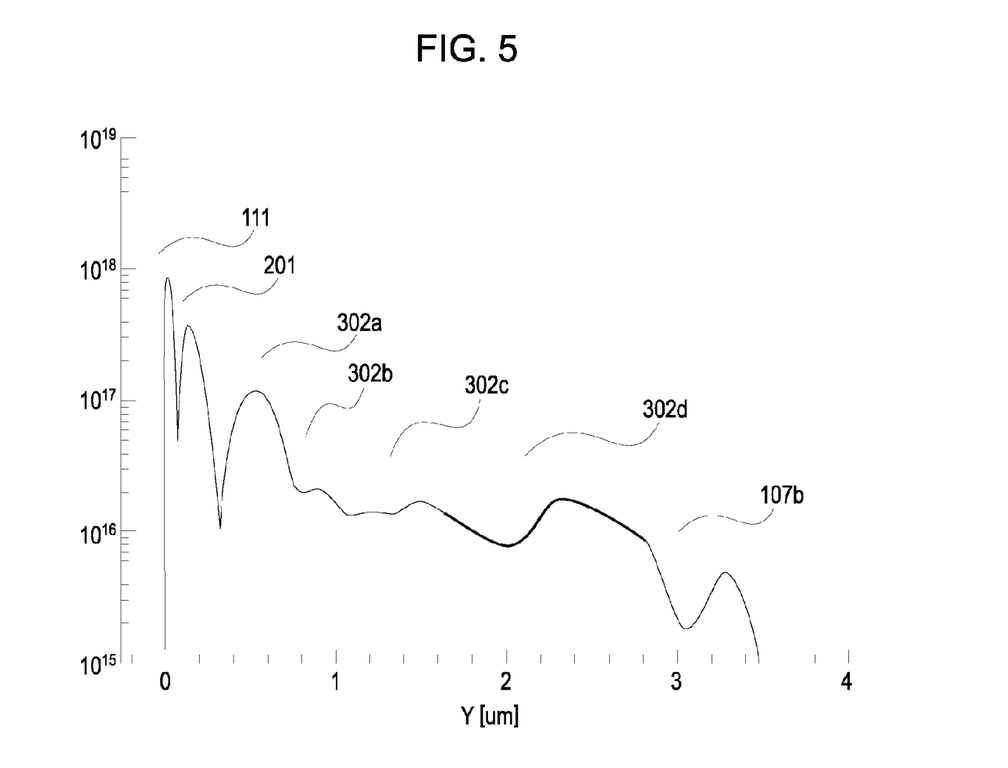
FIG. 5 is a conceptual view illustrating a profile of an impurity concentration in a V-V cross section in FIG. 3.

FIG. 3 is a schematic view of a cross section of a pixel according to this embodiment, and FIG. 4 is a top view of pixels. FIG. 5 is a conceptual view of an impurity profile in the V-V cross section in FIG. 3. FIG. 3 is a cross-sectional view of the III-III portion in FIG. 4. The parts having the same function as that in the first and second embodiments are denoted by the same reference numerals, and a detailed description thereof will be omitted.

A difference between this embodiment and the first and second embodiments is that a P-type semiconductor region 301 (fourth semiconductor region) is disposed under the N-type semiconductor region 110. Another difference is that a P-type semiconductor region 302 (fifth semiconductor region) including a plurality of semiconductor regions is disposed under the P-type semiconductor region 301. Here, the P-type semiconductor region 302 includes four P-type semiconductor regions 302a to 302d. The number of P-type semiconductor regions is not limited thereto.

Reference numeral 301 denotes a high-concentration P-type semiconductor region. The impurity concentration of the P-type semiconductor region 301 is higher than the impurity concentration of the P-type well 107. Preferably, the P-type semiconductor region 301 forms a PN junction directly with the N-type semiconductor region 110 without via the P-type well 107. The profile of impurity concentration in the depth direction of the P-type semiconductor region 301 may be a profile having an impurity concentration peak at a certain depth. Preferably, the peak of the impurity concentration of the P-type semiconductor region 301 is at a position shallower than 0.5 μm from the surface. This is because, if the peak is at a position shallower than 0.5 μm from the surface, a region of a low impurity concentration is not disposed between the N-type semiconductor region 110 and the high-concentration P-type semiconductor region 301. With this configuration, charges can be transferred from the charge holding portion to the sense node at a low voltage. This will be described in detail.

First, a mechanism of transferring charges from the charge holding portion to the sense node will be described. Before signal charges generated in the photoelectric conversion portion 101 are held in the N-type semiconductor region 110, a reset voltage is supplied to the N-type semiconductor region 110 via the sense node. Then, after the potential of the sense node has been floated, charges in the photoelectric conversion portion 101 are transferred to the N-type semiconductor region 110. Then, charges are sequentially transferred from the charge holding portion to the sense node. The transfer is performed in units of pixel rows or in units of a plurality of pixel rows. At this time, the N-type semiconductor region 110 is in a state where a reverse bias is supplied via the transfer portion 103. The reverse bias causes the N-type semiconductor region 110 to be depleted, so that charges are transferred. In order to transfer most of, preferably all of the charges held in the N-type semiconductor region 110 to the sense node, the most part of, preferably, the entire region of the N-type semiconductor region 110 needs to be depleted. In order to suppress expansion of a depletion layer at this time, the N-type semiconductor region 110 preferably forms a PN junction together with the high-concentration P-type semiconductor region 301 without via the P-type well 107. This is because, since the impurity concentration of the P-type semiconductor region that forms a PN junction together with the N-type semiconductor region 110 is high, expansion of a depletion layer to the P-type semiconductor region can be suppressed. Thus, even if a reverse bias voltage that is supplied via the transfer portion is low, the most part of, preferably the entire region of the N-type semiconductor region 110 can be depleted.

Furthermore, in this embodiment, the impurity concentration of the high-concentration P-type semiconductor region 301 is higher than the impurity concentration of a region that is at the same depth as the P-type semiconductor region 301 under the transfer path. In other words, the high-concentration P-type semiconductor region 301 does not extend to under the transfer gate electrode 113. With this configuration, a transfer path can be formed in the P-type well under the transfer gate electrode 113 without increasing the bias voltage that is supplied to the transfer gate electrode 113.

Furthermore, in this embodiment, the P-type semiconductor region 302 is disposed under part of the P-type semiconductor region 301. The P-type semiconductor region 302 extends to under the transfer gate electrode 113 and under the FD 114.

The P-type well 107 includes two regions 107a and 107b. However, the P-type semiconductor region 302 may extend to under only at least part of each of the P-type semiconductor region 301, the transfer gate electrode 113, and the FD 114. Also, ion implantation may be further performed on the region 107b to form a P-type semiconductor region.

End portions of all or some of the plurality of semiconductor regions included in the P-type semiconductor region 302 are offset from the photoelectric conversion portion side in the same pixel, with an end portion of the charge holding portion being a reference. The N-type semiconductor region 106 constituting part of the photoelectric conversion portion is disposed in the offset portion.

In this embodiment, in each of a plurality of pixels, an end portion on the photoelectric conversion portion side of the P-type semiconductor region 302 is offset from the photoelectric conversion portion. This configuration may have sensitivity with respect to light entering in an oblique direction. Such an arrangement may be employed in all the pixels or some of the pixels.

Next, a description will be given with reference to FIG. 4. Reference numeral 401 denotes a portion where a circuit constituting a pixel is disposed. Specifically, the circuit includes an amplifying MOS transistor, a reset MOS transistor, and the like. An example of an equivalent circuit thereof will be described below. Reference numeral 402 denotes an element separation region. This is provided to separate active regions from each other. Any of a field region constituted by an insulating film and a diffusion separation constituted by PN junction separation is disposed. Reference numeral 403 denotes a contact plug that is electrically connected to the FD. The contact plug 403 electrically connects the FD to the gate of the amplifying MOS transistor. Reference numeral 404 denotes an active region where an element is disposed.

In FIG. 4, the region where the P-type semiconductor region 302 is disposed is indicated by a broken line, and the region where the P-type semiconductor region 111 and the N-type semiconductor region 201 are disposed is indicated by a chain line. It can be understood from FIG. 4 that the end portion of the P-type semiconductor region 302 is offset from the photoelectric conversion portion side in the same pixel, with the end portion of the charge holding portion being a reference. As described above, the N-type semiconductor region 106 constituting part of the photoelectric conversion portion is disposed in the offset portion.

FIG. 5 illustrates the profile of the impurity concentration in the V-V cross section in FIG. 3. The vertical axis indicates the net impurity concentration (net concentration) that is compensated for by impurity of the opposite conductivity type. The horizontal axis indicates the depth from one principal surface where a light receiving portion of a semiconductor substrate is disposed. Each of the P-type semiconductor regions 302a to 302d has a peak of impurity concentration.

The P-type semiconductor regions 301 and 302 have a configuration in which a peak value is the highest in a region that is the closest to the surface.

As described above, according to this embodiment, an effect that the sensitivity of the photoelectric conversion portion increases can be obtained in addition to the effects of the first and second embodiments.

Method for Manufacturing Solid-State Image Pickup Device

Figure 6A:
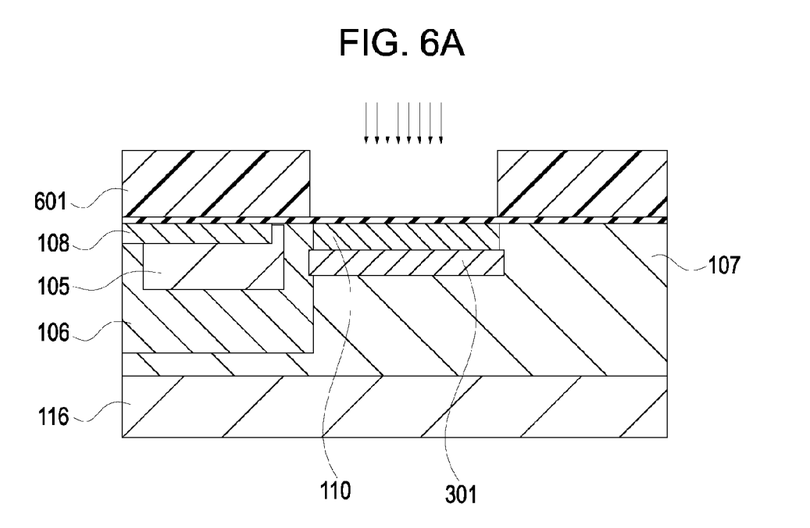
FIGS. 6A and 6B are cross-sectional views of a pixel illustrating an example of a method for manufacturing a solid-state image pickup device according to the present invention.
Figure 6B:
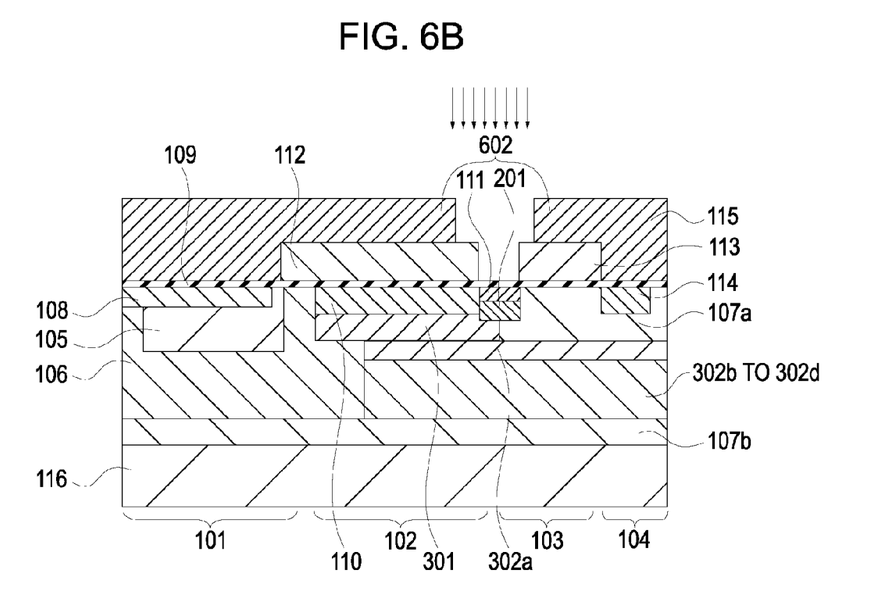

FIGS. 6A and 6B are schematic views of a cross section of a pixel for explaining a process of manufacturing a solid-state image pickup device according to the present invention. The parts having the same function as in each of the embodiments are denoted by the same reference numerals, and a detailed description thereof will be omitted.

A first feature of the manufacturing method is that the N-type semiconductor region 110 and the P-type semiconductor region 301 are formed using an identical mask (first mask). A second feature is that the P-type semiconductor region 111 and the N-type semiconductor region 201 that are disposed in a gap portion between the control electrode 112 and the transfer gate electrode 113 are formed using an identical mask.

A detailed description will be given with reference to FIGS. 6A and 6B. FIGS. 6A and 6B illustrate only the part related to this embodiment. A transistor, etc., in the other part can be manufactured using a known manufacturing method. FIG. 6A is a schematic view of a cross section of a pixel in a state where the P-type semiconductor region 301 is formed. Reference numeral 601 denotes a mask pattern formed of a photoresist.

First, a photoresist is formed over an entire surface of a substrate. Then, the photoresist is exposed so that an opening is formed in a region where the N-type semiconductor region 110 in the charge holding portion is to be disposed.

As a first impurity implantation step of forming the N-type semiconductor region 110, an N-type impurity ion is implanted using a photoresist pattern formed in the exposure step as a mask pattern (first mask pattern). Arsenic or phosphorus may be used as impurity.

Subsequently, without a step of removing the photoresist mask, a P-type impurity ion is implanted as a second impurity implantation step of forming the high-concentration P-type semiconductor region 301. At this time, boron or the like may be used as impurity. Then, heat treatment is performed to recover from crystal defect or the like that occurs during ion implantation. In this way, the N-type semiconductor region 110 and the P-type semiconductor region 301 are formed using the identical mask pattern.

The first impurity implantation step of forming the N-type semiconductor region and the second impurity implantation step of forming the P-type semiconductor region may be performed in the reverse order.

After the N-type semiconductor region 110 and the P-type semiconductor region 301 have been formed, the photo resist mask 601 is removed.

Then, the P-type semiconductor region 302 is formed to be offset from the photoelectric conversion portion using a mask difference from the foregoing first mask. Then, the control electrode 112 and the transfer gate electrode 113 are formed.

Next, a step of forming the P-type semiconductor region 111 and the N-type semiconductor region 201 will be described with reference to FIG. 6B.

First, a photoresist is formed over an entire surface of the substrate. Then, the photoresist is exposed to form a photoresistor mask (second mask) so that the semiconductor substrate is covered except the gap portion between the control electrode 112 and the transfer gate electrode 113. In order to perform ion implantation so that self-alignment is achieved with respect to the control electrode 112 and the transfer gate electrode 113, the photoresist is formed to cover at least part of the control electrode 112 and the transfer gate electrode 113 and the other region.

Then, ion implantation of a P-type impurity is performed with self-alignment with respect to the control electrode 112 and the transfer gate electrode 113, so as to form the P-type semiconductor region 111 (third impurity implantation step). Then, ion implantation of an N-type impurity is performed without removing the second mask, so as to form the N-type semiconductor region 201 (fourth impurity implantation step). As a condition of this ion implantation, a dose of impurity ion is set to be higher than that in the first impurity implantation step so that the impurity concentration of the N-type semiconductor region 201 is higher than at least that of the N-type semiconductor region 110. Then, heat treatment is performed to recover from crystal defect or the like that occurs during ion implantation.

According to the above-described manufacturing method, the P-type semiconductor regions 301 and 111 and the N-type semiconductor region 201 can be formed without the necessity for significantly increasing the manufacturing steps. Furthermore, displacement of the N-type semiconductor region 110 and the P-type semiconductor region 301 in the direction horizontal to the substrate surface can be reduced. Accordingly, a portion where the N-type semiconductor region 110 and the P-type semiconductor region 301 directly form a PN junction can be increased. Also, displacement of the P-type semiconductor region 111 and the N-type semiconductor region 201 can be suppressed, and transfer variations of the individual pixels can be suppressed.

Any one of the first and second impurity implantation steps and the third and fourth impurity implantation steps may be performed using an identical mask.

Equivalent Circuit of Solid-State Image Pickup Device

Figure 7:
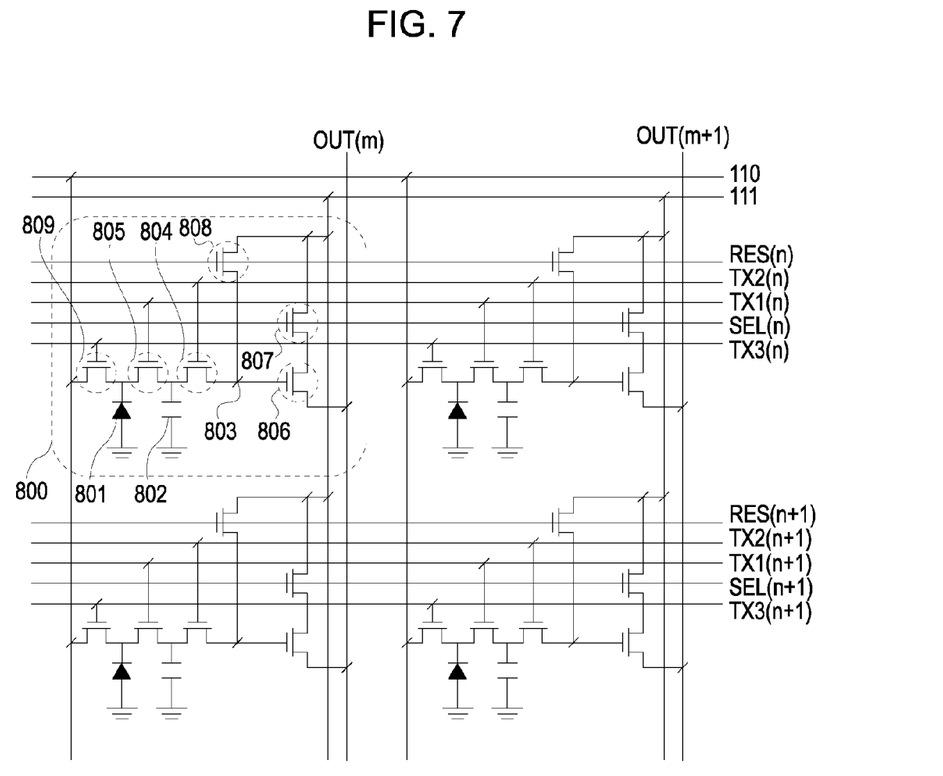
FIG. 7 is an equivalent circuit diagram of the solid-state image pickup device according to the present invention.

FIG. 7 is an equivalent circuit diagram of a solid-state image pickup device that can be applied to all the foregoing embodiments. The solid-state image pickup device having this equivalent circuit can perform a global electronic shutter operation.

Reference numeral 801 denotes a photoelectric conversion portion. A photodiode is used here. Reference numeral 802 denotes a charge holding portion, which holds signal charges generated by the photoelectric conversion portion. Reference numeral 803 denotes a sense node of an amplifying portion. For example, an FD and a gate electrode of an amplifying transistor that is electrically connected to the FD correspond to the sense node. Reference numeral 804 denotes a first transfer portion, which transfers charges in the charge holding portion to the sense node of the amplifying portion. Reference numeral 805 denotes a second transfer portion that is provided as necessary. The second transfer portion can also function as a control electrode of the charge holding portion. The second transfer portion may not have a transfer function, and may have only a function as the control electrode in the charge holding portion. The function of the second transfer portion is transferring charges in the photoelectric conversion portion to the charge holding portion. Reference numeral 808 denotes a reset portion, which supplies a reference voltage to at least an input portion of the amplifying portion. Furthermore, the reset portion may supply a reference voltage to the charge holding portion. Reference numeral 807 denotes a selecting portion that is provided as necessary. The selecting portion 807 causes a signal line to output signals of respective pixel rows. Reference numeral 806 denotes an amplifying transistor constituting the amplifying portion. The amplifying transistor 806 constitutes a source follower circuit together with a constant current source provided to the signal line. Reference numeral 809 denotes a charge output control portion, which controls the connection between the photoelectric conversion portion and a power supply line functioning as an overflow drain (hereinafter OFD).

The equivalent circuit is not limited thereto, and part of the configuration may be shared by a plurality of pixels. Also, the equivalent circuit can be applied to a configuration in which control wiring of individual elements is fixed at a certain voltage and in which control of conduction is not performed.

The second transfer portion may have a buried channel MOS transistor configuration so that charges generated by the photoelectric conversion portion immediately flow into the charge holding portion. In this configuration, there is a portion where an energy barrier is partially low at a portion deeper than a surface even in a non-conduction state. In this case, the second transfer portion can be brought into a state where a certain voltage is supplied without performing active control. That is, a fixed potential barrier may be provided instead of a function as a transfer portion.

According to such a configuration, most of signal charges generated through photoelectric conversion when light enters the photoelectric conversion portion are not accumulated in the photoelectric conversion portion and can be transferred to the charge holding portion. Accordingly, a charge accumulation time can be made uniform in the photoelectric conversion portions of all the pixels. Also, when the MOS transistor is in a non-conduction state, holes are accumulated on the surface of a channel, and the channel for transferring charges exists at a predetermined depth with respect to the surface. Thus, an influence of a dark current on the interface of an insulating film can be reduced.

From another point of view, during a period when signal charges are accumulated in the photoelectric conversion portion and the charge holding portion, the potential of the charge path between the photoelectric conversion portion and the charge holding portion is lower than the potential of the charge path between the photoelectric conversion portion and the OFD region. Here, the potential means the potential with respect to signal charges.

Furthermore, from the viewpoint of drive, charges moved from the photoelectric conversion portion to the charge holding portion in one exposure period are held in the charge holding portion and are used as an image signal. That is, after one exposure period in the photoelectric conversion portion starts, a signal is read to the outside of the pixel without through a reset operation of the charge holding portion. Note that one exposure period is commonly determined in the individual photoelectric conversion portions when an image of one frame is captured.

In such a pixel configuration, charges can be transferred at a low voltage from the photoelectric conversion portion to the charge holding portion, which is more preferable from the viewpoint of increasing charge transfer efficiency at a low voltage in combination with the embodiments of the present invention.

In such a configuration, global exposure can be performed relatively easily, but the charges in the photoelectric conversion portion are discharged to the OFD region during transfer from the charge holding portion to the FD region. Thus, an image is intermittent. In a case where continuity of an image is particularly necessary in such a configuration, a continuous image can be obtained by performing line exposure. Both can be switched as necessary.

Also, the present invention can be carried out also in a solid-state image pickup device in which a charge holding portion is provided in each pixel for increasing a dynamic range and in which charges are transferred from the charge holding portion to a sense node.

The present invention is not limited to the individual embodiments, and various modifications are acceptable without deviating from the concept of the invention. For example, the present invention can be applied to a configuration that does not include the control electrode 112. For example, the N-type semiconductor region 110 may be selectively connected to the power via the contact plug and switch.

According to the present invention, charge transfer efficiency from a charge holding portion to an FD can be increased regardless of the impurity concentration of the charge holding portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Application No. PCT/JP2009/067600, filed Oct. 9, 2009, which is hereby incorporated by reference herein in its entirety.

What is claimed is:

1. A pickup device including a plurality of pixels, each pixel comprising:
a photoelectric conversion portion that generates charges in accordance with incident light;
a charge holding portion that includes a first semiconductor region of a first conductivity type that holds the generated charges in a portion different from the photoelectric conversion portion; and
a transfer portion that includes a transfer gate electrode that controls a potential between the charge holding portion and a sense node,
wherein the charge holding portion includes a control electrode that is disposed above the first semiconductor region via an insulating film,
wherein a second semiconductor region of a second conductivity type, is disposed on a surface of a semiconductor region between the control electrode and the transfer gate electrode,
wherein a third semiconductor region of a first conductivity type, is disposed in a charge path below the second semiconductor region and has a portion which is not overlapped with the first semiconductor region, and
wherein an impurity concentration of the portion of the third semiconductor region is higher than an impurity concentration of the first semiconductor region.

2. The pickup device according to claim 1, wherein a conductivity-type of the first and third semiconductor regions are opposite to a conductivity-type of the second semiconductor region.

3. The pickup device according to claim 1, wherein a fourth semiconductor region is disposed below the first semiconductor region so as to form a PN junction together with the first semiconductor region.

4. The pickup device according to claim 3, wherein the sense node includes a floating diffusion, and wherein a fifth semiconductor region is disposed at a position deeper than the fourth semiconductor region, the fifth semiconductor region extending below at least part of the fourth semiconductor region, the transfer gate electrode, and the floating diffusion.

5. The pickup device according to claim 4, wherein the fifth semiconductor region is configured to include a plurality of semiconductor regions that are at different depths.

6. The pickup device according to claim 1, wherein a charge path extending between the photoelectric conversion portion and the charge holding portion is a buried channel.

7. The pickup device according to claim 1, wherein the third semiconductor region is disposed in the charge path extending from the charge holding portion to the sense node.

8. A pickup device including a plurality of pixels, each pixel comprising:
- a photoelectric conversion portion configured to generate charges in accordance with incident light;
- a charge holding portion configured to include a first semiconductor region of a first conductivity type that holds the generated charges in a portion different from the photoelectric conversion portion; and
- a transfer portion configured to include a transfer gate electrode that controls a potential between the charge holding portion and a sense node,
- wherein the charge holding portion includes a control electrode that is disposed above the first semiconductor region via an insulating film,
- wherein a second semiconductor region of a second conductivity type, is disposed on a surface of a semiconductor region between the control electrode and the transfer gate electrode,
- wherein a third semiconductor region of a first conductivity type, is disposed in a charge path below the second semiconductor region, and
- wherein an impurity concentration of the third semiconductor region is higher than an impurity concentration of the first semiconductor region,
- wherein a fourth semiconductor region is disposed below the first semiconductor region so as to form a PN junction together with the first semiconductor region,
- wherein the sense node includes a floating diffusion, and
- wherein a fifth semiconductor region is disposed at a position deeper than the fourth semiconductor region, the fifth semiconductor region extending below at least part of the fourth semiconductor region, the transfer gate electrode, and the floating diffusion,
- wherein the fifth semiconductor region is configured to include a plurality of semiconductor regions that are at different depths,
- wherein, in each of the pixels, an end portion on a photoelectric conversion portion side of the fifth semiconductor region is at a position away from the photoelectric conversion portion compared to an end portion on a photoelectric conversion portion side of the second semiconductor region, and
- wherein a sixth semiconductor region that constitutes part of the photoelectric conversion portion is disposed below at least part of the second semiconductor region.

9. The pickup device according to claim 8, wherein a conductivity-type of the first, third and sixth semiconductor regions are opposite to a conductivity-type of the second, fourth and fifth semiconductor regions.

10. A method for manufacturing the pickup device according to claim 9, wherein the second semiconductor region and the third semiconductor region are formed using an identical mask in a self-aligned manner with respect to the control electrode and the transfer gate electrode.

* * * * *